United States Patent
Kimura et al.

(10) Patent No.: US 6,349,870 B1
(45) Date of Patent: Feb. 26, 2002

(54) METHOD OF MANUFACTURING ELECTRONIC COMPONENT

(75) Inventors: Yuji Kimura, Otsu; Shigeto Taga, Kanazawa, both of (JP)

(73) Assignee: Murata Manufacturing Co., LTD ( * ) Notice: Subject to any disclaimer, the term of this patent is extended or adjusted under 35 U.S.C. 154(b) by 0 days.

(21) Appl. No.: 09/537,381

(22) Filed: Mar. 29, 2000

(30) Foreign Application Priority Data

Apr. 12, 1999 (JP) ............................................. 11-104362

(51) Int. Cl.$^7$ .............................. B23K 1/06; B23K 5/20; B23K 20/10; B23K 31/02
(52) U.S. Cl. ..................... 228/110.1; 111/123; 437/183
(58) Field of Search .............................. 228/110.1, 111, 228/123; 437/183; 257/712

(56) References Cited

U.S. PATENT DOCUMENTS

| | | | |
|---|---|---|---|
| 4,907,734 A | * | 3/1990 | Conru et al. ................ 228/123 |
| 5,071,787 A | * | 12/1991 | Mori et al. ................. 437/183 |
| 5,103,290 A | * | 4/1992 | Temple et al. ................ 357/74 |
| 5,201,454 A | * | 4/1993 | Alfaro et al. ................ 228/110 |
| 5,276,955 A | * | 1/1994 | Noddin et al. ................ 29/593 |
| 5,341,979 A | * | 8/1994 | Gupta ......................... 228/111 |
| 5,451,274 A | * | 9/1995 | Gupta ......................... 148/512 |
| 5,646,068 A | * | 7/1997 | Wilson et al. ............... 437/183 |
| 5,655,700 A | * | 8/1997 | Pham et al. ................. 228/106 |
| 5,744,863 A | * | 4/1998 | Culnane et al. .............. 257/712 |
| 5,786,271 A | * | 7/1998 | Ohida et al. ................ 438/615 |
| 5,897,341 A | * | 7/1998 | Love et al. ................. 438/125 |
| 6,087,756 A | * | 8/1998 | Shibutani ................ 310/313 B |
| 5,821,627 A | * | 10/1998 | Mori et al. ................. 257/780 |
| 5,867,074 A | * | 2/1999 | Ogiso et al. ................ 333/193 |
| 5,873,161 A | * | 2/1999 | Chen et al. ................... 29/830 |
| 6,127,731 A | * | 3/1999 | Hoffmeyer ................... 257/750 |
| 5,990,552 A | * | 11/1999 | Xie et al. ................... 257/718 |

FOREIGN PATENT DOCUMENTS

| | | | | |
|---|---|---|---|---|
| EP | 0336359 A2 | * | 10/1989 | ............. 228/110.1 |
| JP | 9-115911 A | * | 5/1997 | ............. 228/234.1 |
| JP | 10-107078 A | * | 4/1998 | ............. 228/110.1 |
| JP | 10-289926 A | * | 10/1998 | ............. 228/234.1 |

* cited by examiner

*Primary Examiner*—Tom Dunn
*Assistant Examiner*—L. Edmondson
(74) *Attorney, Agent, or Firm*—Keating & Bennett, LLP

(57) ABSTRACT

A method of manufacturing an electronic component includes bonding an electronic component via a bump to electrically and mechanically connect the electronic component to a base member and bonding a cap member to the base member in such a manner that the cap member covers the electronic component element. High temperature aging is performed after bonding the electronic component to the base member via the bump.

16 Claims, 3 Drawing Sheets

METHOD OF MANUFACTURING ELECTRONIC COMPONENT

BACKGROUND OF THE INVENTION

1. Field of the Invention

The present invention relates to a method of manufacturing an electronic component in which an electronic component element such as a surface acoustic wave element or a semiconductor element is bonded via a bump to electrically and mechanically connect the electronic component element to a base member.

2. Description of the Related Art

Electronic component elements which are bump-bonded so as to be mounted on base members and so as to hermetically seal the electronic components in packages by bonding the base members to cap members are known. In such electronic components, electronic component elements are opposed to the base members, and electrode pads of the electronic component elements are bonded to corresponding electrode lands of the base members via bumps made of Au or other suitable material so as to supportively fix and electrically connect the electronic component elements to the base members. After that, cap members are bonded to the base members by seam welding or by using a brazing material such as solder to produce electronic components.

The above-described bump bonding is performed by positioning the electronic component elements opposite to the base members, and, for example, heat and pressure are applied while applying an ultrasonic wave. Usually, the time of the bump bonding (application of an ultrasonic wave, heat, and pressure) is approximately one second or less. The conditions for bonding, such as an ultrasonic wave output to be applied, pressure to be applied (load), and a temperature are set such that a higher degree of bonding strength (sharing strength) can be obtained. For example, in Japanese Unexamined Patent publication No. 10-07078, an ultrasonic wave output is in a range of 0.04 to 0.42 W/bump, and an applied pressure is in a range of 150 to 350 gf/bump to perform bump bonding. With these conditions, a solid-phase diffusion area formed by the electrodes and the bumps is expanded, by which the strength of bump bonding can be increased.

However, in the above-described conventional method of manufacturing an electronic component, although the bonding strength can be increased by changing the bonding conditions during bump bonding, the time of bonding for achieving bump bonding is very short. Thus, there is a limitation to the expansion of the solid-phase diffusion area, and a sufficient bonding strength cannot be achieved. In other words, when bump bonding is performed, mutual diffusion of the bump material and the electrode material is generated to form the solid-phase diffusion area so as to achieve the bonding of the bumps and the electrodes. However, since the time of bonding is short when bump bonding is performed, it is impossible to obtain a sufficient solid-phase diffusion area only by bump bonding. In addition, there is a problem that a targeted bonding strength cannot be obtained due to variations in materials and dimensions of component members, and variations in bonding conditions occurring when bonding is performed.

SUMMARY OF THE INVENTION

In order to overcome the problems described above, preferred embodiments of the present invention provide a method of manufacturing a surface acoustic wave device, in which a solid-phase diffusion area define by a bump and an electrode bonded to the bump is expanded so as to increase the strength of bump bonding so as to prevent connection failures at the portion bonded by the bump and so that excellent reliability is achieved.

According to one preferred embodiment of the present invention, a method of manufacturing an electronic component includes the steps of bonding an electronic component element to a base member via a bump to electrically and mechanically connect the electronic component element to the base member and bonding a cap member to the base member in such a manner that the cap member covers the electronic component element. In this method, after the electronic component element is bonded to the base member via the bump, high temperature aging is performed.

With the above method for manufacturing an electronic component, the high temperature aging causes the solid-phase diffusion area defined by the bump, the electrode of the electronic component element, and the electrode of the base member, which are bonded to the bump, to be greatly expanded. In addition, the stable solid-phase diffusion area in which there are slight variations can be obtained, and the strength of bump bonding is greatly increased as a result.

The above-described high temperature aging may be performed either before or after the bonding of the base member and the cap member. Alternatively, when bump bonding is performed, high temperature aging may be performed following the bump bonding procedure.

Furthermore, high temperature aging may be performed at the same time, when the base member is bonded to the cap member. In this case, since it is necessary to simply add a time equivalent to the time used for the procedure of high temperature aging, the number of steps in the production process can be reduced.

Other features, characteristics, advantages and steps of preferred embodiments of the present invention will become more apparent from the detailed description below in conjunction with the attached drawings.

For the purpose of illustrating the invention, there is shown in the drawings several forms which are presently preferred, it being understood, however, that the invention is not limited to the precise arrangements and instrumentalities shown.

DETAILED DESCRIPTION OF PREFERRED EMBODIMENTS

A method of manufacturing an electronic component according to the present invention will be illustrated with an example of a surface acoustic wave device below.

Figure 1:
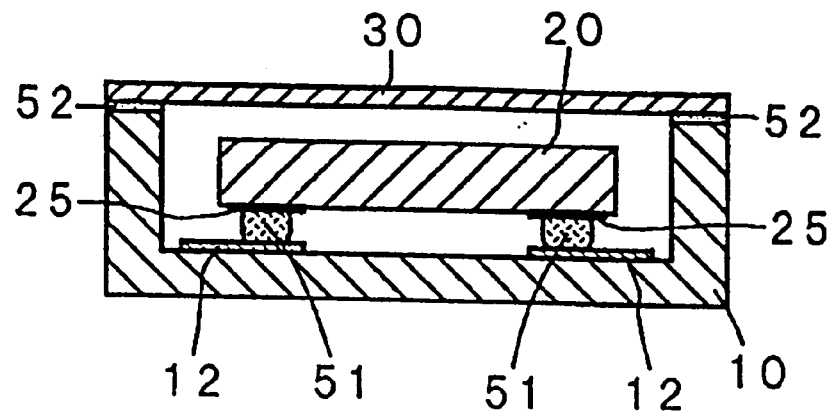
FIG. 1 is a sectional view of a surface acoustic wave device according to a preferred embodiment of the present invention.

In the surface acoustic wave device according to a preferred embodiment of the present invention, as shown in FIG. 1, a plurality of electrode pads 25 of a surface acoustic wave element 20 and a plurality of electrode lands 12 on the upper surface inside the recess of a base member 10 are bonded via bumps 51 which are preferably made of Au or other suitable material. A cap member 30 is preferably bonded to the base member 10 preferably via a brazing material 52 such as high melting point solder or other suitable material in such a manner that the cap member 30 covers the surface acoustic wave element 20, by which the surface acoustic wave element 20 is hermetically sealed inside a package (in a space) defined between the base member 10 and the cap member 30.

The base member 10 preferably has a recess-like shape and is preferably formed by laminating a ceramic material such as alumina or other suitable material. On the upper surface of the base member 10 inside the recess, the plurality of the electrode lands 12 made of Au or other suitable material are provided. On the lower surface of the base member 10, a plurality of terminal electrodes connected to the electrode lands 12 via through-holes or other suitable connection members are provided. This structure allows the lower surface of the base member 10 to be used as the mounting surface, although this is not shown in the figure. The surface acoustic wave element 20 preferably includes a piezoelectric substrate made of a material such as LiTaO$_3$, LiNbO$_3$, or quartz or other suitable materials. On the piezoelectric substrate, an electrode pattern including IDT electrodes made of Al or other suitable materials and the electrode pads 25 connected to the IDT electrodes are preferably formed by a known thin-film forming method or other suitable processes.

A method of manufacturing a surface acoustic wave device according to a preferred embodiment of the present invention will be illustrated below.

First, on each of the electrode pads 25 of the surface acoustic wave element 20, a bump 51 which is preferably made of Au or a material including Au as a main component is formed preferably via a ball bonding method. However, the method for forming a bump is not restricted to the ball bonding method. For example, other bump-forming methods such as a bump forming by plating may be used. In addition, the bump 51 may be formed in advance on the electrode land 12 of the base member 10.

Figure 2:
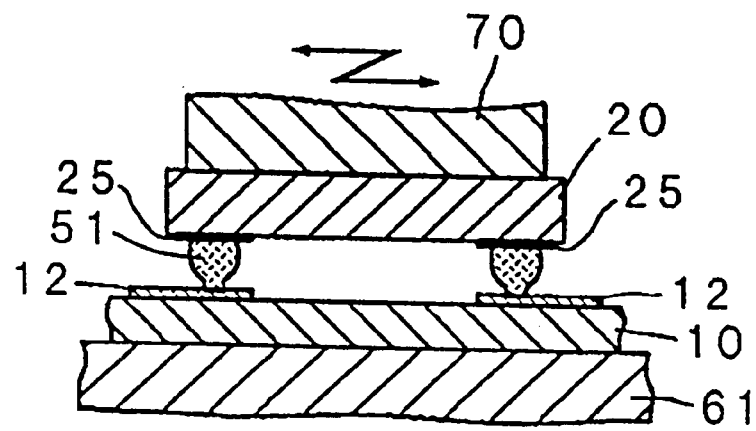
FIG. 2 is a sectional view of the surface acoustic wave device according to a preferred embodiment, obtained when bump bonding is performed.

Next, as shown in FIG. 2, the base member 10 is placed on a heat stage 61, and then, each of the electrode lands 12 on the base member 10 and each of the electrode pads 25 of the surface acoustic wave element 20, which corresponds to each of the electrode lands 12, are opposed to each other via the bumps 51 to mount the surface acoustic wave element. Sequentially, the base member 10 is heated by the heat stage 61, pressure is applied onto the base member 10 while applying an ultrasonic wave (oscillation) by an ultrasonic wave tool 70, and the electrode pads 25 and the electrode lands 12 are bonded via the bumps 51. In this case, when bonding is performed by the bumps, the time for applying heat, pressure, and the ultrasonic wave is approximately 0.5 seconds, and the temperature for heating is approximately 200° C. Usually, when the above-described bump bonding (the bonding of Au and Au) is performed by simultaneously applying an ultrasonic wave and heat, the temperature for heating is in a range of about 100° C. to about 200° C., and the time for applying the ultrasonic wave is within approximately one second. Furthermore, when only heat is applied without applying an ultrasonic wave, the temperature for heating is preferably within the range of about 300° C. to about 400° C.

Figure 3:
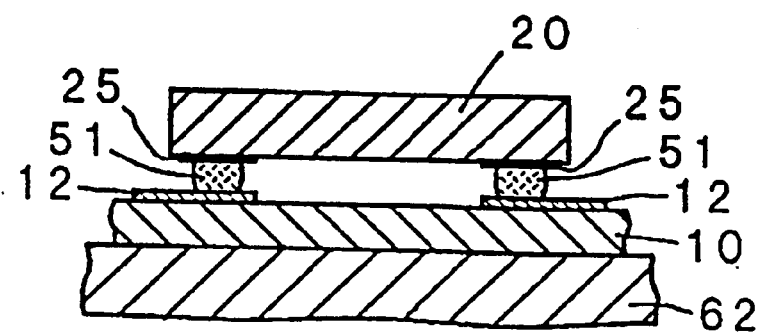
FIG. 3 is a sectional view of the surface acoustic wave device according to a preferred embodiment, obtained when high temperature aging is performed.

Next, as shown in FIG. 3, a surface acoustic wave device is placed inside a heating device 62 such as a constant temperature bath or on the heating device 62, and, for example, high temperature aging is performed for approximately 5 to 20 minutes at a temperature of about 300° C.

Figure 4:
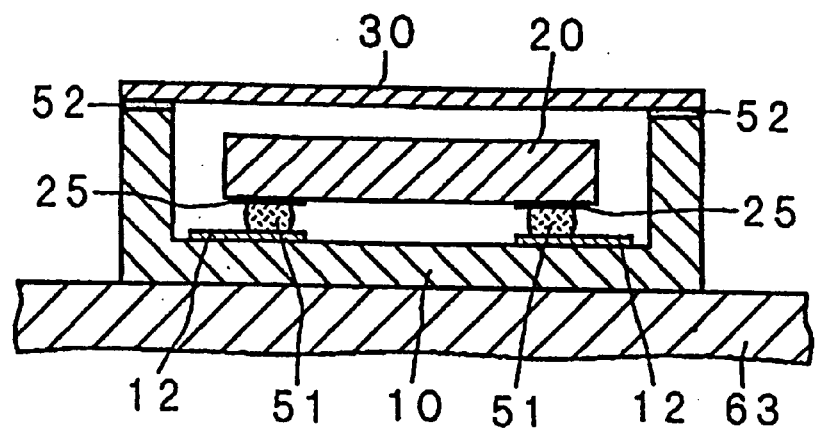
FIG. 4 is a sectional view of the surface acoustic wave device according to a preferred embodiment, obtained when a base member is bonded to a cap member.

Next, as shown in FIG. 4, a cap member 30, on which a high melting point solder or other suitable material defining a brazing material 52 is press-bonded in advance, is stacked onto the base member 10, and the brazing material 52 is heated and melted by a heating device 63 such as a reflow furnace so as to bond the base member 10 and the cap member 30. The bonding is performed under conditions of the reflowing temperature of about 200° C. to about 360° C. and the reflowing time of approximately 20 seconds. In this case, the bonding of the base member and the cap member may be performed by other bonding methods such as seam welding or resin bonding. As the brazing material, as an alternative to solder, an alloy of Au and Sn, or a low melting point glass may be used. In addition, the brazing material may be preliminarily formed on the base member, or may be formed by printing or by other suitable processes.

In the method for producing the surface acoustic wave device of this preferred embodiment, since high temperature aging is performed after the surface acoustic wave element 20 is bonded to the base member 10 via the bumps, the solid-phase diffusion area defined by the bumps 51, the electrode pads 25, and the electrode lands 12 is greatly increased and expanded, and variations in the solid-phase diffusion area occurring due to variations in the bonding conditions during bump bonding are significantly reduced. In other words, with the performance of high temperature aging, the solid-phase diffusion area defined by the bumps and the electrodes bonded to the bumps is greatly expanded. Additionally, a stable solid-phase diffusion area in which there are slight variations can be obtained. Thus, the strength of bump bonding is greatly increased.

In the above preferred embodiment, it is described that high temperature aging is performed before bonding of the base member and the cap member. However, high temperature aging may be performed at the same time, when the base member and the cap member are bonded. In other words, the process of bonding the base member 10 and the cap member 30 within the reflow furnace, which is described by referring to FIG. 4 can be performed under conditions in which the time of approximately 5 to 20 minutes as the time for high temperature aging is added to the bonding time of approximately 20 seconds so as to simultaneously perform both the bonding of the base member 10 to the cap member 30 and the high temperature aging. With this arrangement, it is not necessary to additionally perform the step of high-temperature aging. Thus, the number of steps in the production can be reduced, and production cost can thereby be lower than that of the above preferred embodiment. In this case, the maximum value of the reflowing temperature is preferably within about 10° C. to about 100° C. higher than the melting point of the brazing material.

In addition, high temperature aging may be performed after bonding of the base member and the cap member. In this case, it is preferable that the temperature of high temperature aging is lower than the melting point of the brazing material.

In addition, the heating device used for high temperature aging is not restricted to a constant temperature bath or a reflow furnace. Other heating devices such as a hot plate may be used. If a heat stage used in the process of bump bonding is also used to achieve aging, then high temperature aging can be continuously performed after bump bonding, which further reduces the number of steps in the manufacturing method.

In addition, the electrode pads of the surface acoustic wave element, the electrode lands of the base member, the material of the bump are not restricted to those shown in the above preferred embodiment. For example, as the material of a bump, a metallic material such as solder may be used. As the electrode pad, an electrode of Au or other suitable material may be formed on an electrode made of Al. As the electrode land, an electrode in which Ni plating or Au plating is performed on an electrode made of W or Mo may be used.

The conditions (temperature and time) for high temperature aging are determined according to the materials of these component members, conditions for bump bonding, conditions for bonding the base member and the cap member. Particularly, the temperature for high temperature aging is preferably a temperature at which the solid-phase diffusion area defined by the bumps and the electrodes bonded to the bumps is most efficiently expanded.

Figure 5:
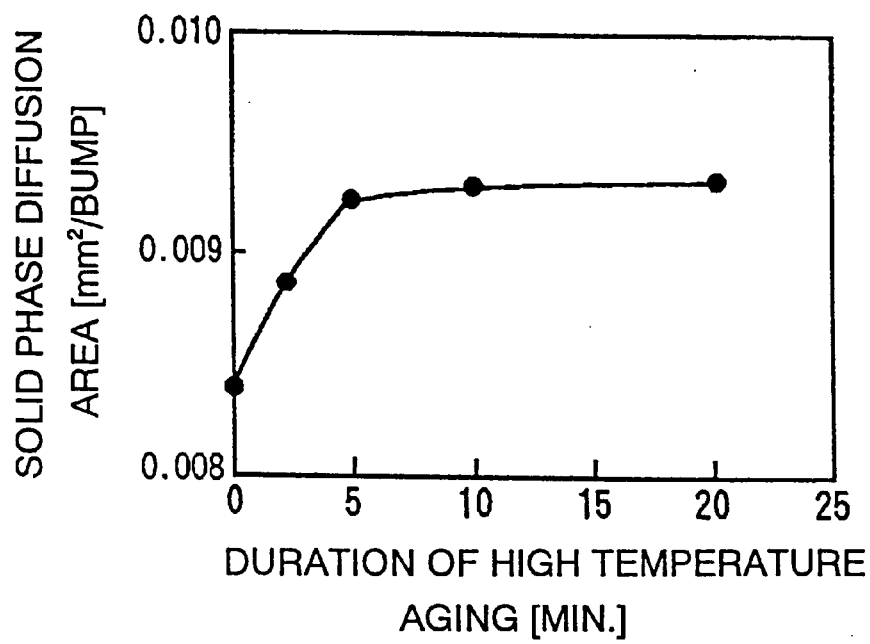
FIG. 5 is a graph showing the relationship between the time of high temperature aging and the solid-phase diffusion area in the surface acoustic wave device according to a preferred embodiment of the present invention.
Figure 6:
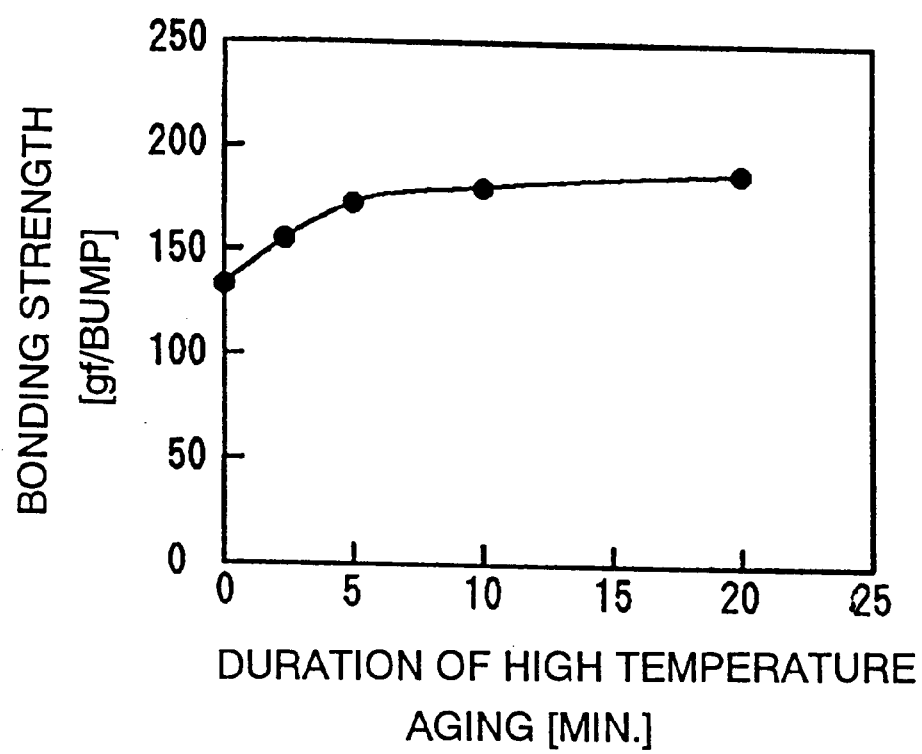
FIG. 6 a graph showing the relationship between the time of high temperature aging and bonding strength in the surface acoustic wave device according to a preferred embodiment of the present invention.

Next, the operation and advantages of preferred embodiments of the present invention will be illustrated by referring to FIGS. 5 and 6.

FIG. 5 shows the relationship between the time for high temperature aging and the solid-phase diffusion area, and FIG. 6 shows the relationship between the time for high temperature aging and the strength of bonding. The data are mean values obtained from ten samples. In these figures, there is provided data regarding parts where the electrode pads of a surface acoustic wave element and bumps were bonded under conditions in which high temperature aging was performed at a temperature of about 300° C., a base member being made of alumina, the electrode lands being made of Au, the piezoelectric substrate of the surface acoustic wave element being made of $LiTaO_3$, the electrode pads thereof being made of Al, and the bumps being made of Au. As seen in FIGS. 5 and 6, it is clearly seen that, with the performance of high temperature aging, the solid-phase diffusion area is greatly expanded, thereby significantly improving the bonding strength. In addition, it is seen that, for initial five minutes of the aging time, the solid-phase diffusion area and the bonding strength increase approximately in proportion to the time. Thus, the time for high temperature aging is preferably about five minutes or longer.

Although a metallic material is preferably used for the cap member in the above preferred embodiments, the cap member is not restricted to a metal member. A ceramic cap member may be used in other preferred embodiments of the present invention. In addition, the shapes of the base member and the cap member are not restricted to those shown in the preferred embodiments described above. For example, a base member having a plate configuration and a cap member having a recess configuration may be used to form a package.

In addition, although the above preferred embodiments uses the surface acoustic wave device as an example, it is also possible to apply the present invention, for example, to a semiconductor device in which a semiconductor element is bonded to a base member via bumps.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A method of manufacturing an electronic component comprising the steps of:
   bonding a cap member to the base member in such a manner that the cap member covers the electronic component element; and
   high temperature aging the attached electronic component element, the base member and the bump such that a solid phase diffusion area is defined by the bump, the electrode of the electronic component element and the electrode of the base member, and solid phase diffusion occurs between the bump, the electrode of the electronic component element and the electrode of the base member due to the solid phase diffusion area expanding during high temperature aging;
   wherein the step of high temperature aging is performed at a temperature that is lower than the melting temperature of the bump material and is performed after the steps of bonding the electronic component and bonding the cap member.

2. The method according to claim 1, further comprising the step of:
   configuring the electronic component to be a surface acoustic wave element.

3. The method according to claim 2, further comprising the step of:
   providing the surface acoustic wave element with a plurality of electrode pads and the base member includes a plurality of electrode lands, and the electrode pads are connected to the electrode lands via the bump.

4. The method according to claim 1, wherein the bump is made of Au.

5. The method according to claim 1, wherein the cap member is made of metal.

6. The method according to claim 1, wherein the cap member is made of ceramic.

7. The method according to claim 1, wherein the step of bonding the cap member to the base member includes the steps of providing a brazing material between the cap member and the base member and melting the brazing material.

8. The method according to claim 1, wherein the bump is formed on the mounting member via a ball bonding method.

9. The method according to claim 1, wherein the step of bonding the electronic component element onto the base member includes placing the base member and the electronic component element into a heat stage and heating the base member and the electronic component element.

10. The method according to claim 9, wherein during the step of heating the base member and the electronic component element, pressure is applied onto the base member while applying an ultrasonic wave thereto.

11. The method according to claim 10, wherein during the step of bonding, the time for applying heat, pressure, and the ultrasonic wave is approximately 0.5 seconds and the temperature for heating is approximately 200° C.

12. The method according to claim 10, wherein during the step of bonding, the time for applying heat, pressure, and the ultrasonic wave is approximately 1.0 seconds and the temperature for heating is approximately 100° C. to 200° C.

13. The method according to claim 9, wherein the temperature for heating is preferably within the range of about 300° C. to about 400° C.

14. The method according to claim 1, wherein the step of bonding the electronic component element to the base member is performed via one of reflow heating, seam welding and resin bonding.

15. The method according to claim 1, wherein the step of bonding the electronic component element to the base member is performed via reflow heating of a brazing material at a temperature is within about 10° C. to about 100° C. higher than the melting point of the brazing material.

16. The method according to claim 1, wherein the step of bonding the electronic component element to the base member is performed via reflow heating of a brazing material at a temperature is lower than the melting point of the brazing material.

* * * * *